United States Patent
Fosnight et al.

(10) Patent No.: US 6,216,873 B1
(45) Date of Patent: Apr. 17, 2001

(54) SMIF CONTAINER INCLUDING A RETICLE SUPPORT STRUCTURE

(75) Inventors: William J. Fosnight, Austin, TX (US); Raymond S. Martin, San Jose, CA (US); Joshua W. Shenk, Austin, TX (US); Robert P. Wartenbergh, Woodside, CA (US)

(73) Assignee: Asyst Technologies, Inc., Fremont, CA (US)

(*) Notice: Subject to any disclaimer, the term of this patent is extended or adjusted under 35 U.S.C. 154(b) by 0 days.

(21) Appl. No.: 09/272,132

(22) Filed: Mar. 19, 1999

(51) Int. Cl.$^7$ .................................................. B65D 85/90
(52) U.S. Cl. ......................................... 206/710; 206/454
(58) Field of Search ............................... 206/453, 454, 206/455, 459.5, 710, 719, 722–724, 561, 586, FOR 328, 591, 594

(56) References Cited

U.S. PATENT DOCUMENTS

| | | | |
|---|---|---|---|
| 4,160,504 | * | 7/1979 | Kudlich et al. ...................... 206/454 |
| 4,830,182 | * | 5/1989 | Nakazato et al. ..................... 206/710 |
| 5,314,068 | * | 5/1994 | Nakazato et al. ..................... 206/710 |
| 5,353,934 | * | 10/1994 | Yamauchi ............................ 206/723 |
| 5,373,936 | * | 12/1994 | Kawai et al. ......................... 206/723 |
| 5,375,710 | * | 12/1994 | Hayakawa et al. .................. 206/724 |
| 5,474,177 | * | 12/1995 | Abrams et al. ...................... 206/710 |
| 5,725,100 | * | 3/1998 | Yamada ................................ 206/710 |
| 5,921,397 | * | 7/1999 | Whalen ................................ 206/454 |

\* cited by examiner

*Primary Examiner*—Luan K. Bui
(74) *Attorney, Agent, or Firm*—Fliesler Dubb Meyer & Lovejoy LLP

(57) ABSTRACT

A reticle support mechanism is disclosed in which a reticle may be quickly and easily located and removed, and which is capable of securely supporting a reticle for storage and/or transport. A preferred embodiment of the present invention includes a pair of reticle supports mounted to a door of a container, and a pair of reticle retainers mounted to a shell of the container. When the container shell is coupled with the container door, sections of the reticle support and reticle retainer engage chamfered edges of the reticle and sandwich the reticle in a secure position within the container. As a result of engaging the reticle at its chamfered edges, potentially harmful contact with the upper and lower surfaces and vertical edges of the reticle is avoided.

6 Claims, 16 Drawing Sheets

SMIF CONTAINER INCLUDING A RETICLE SUPPORT STRUCTURE

CROSS REFERENCE TO RELATED APPLICATION

This application is related to U.S. patent application Ser. No. 09/247,695, pending entitled, "RETICLE TRANSFER SYSTEM", to Bonora et al., which application is incorporated by reference herein in its entirety and which application is assigned to the owner of the present application.

BACKGROUND OF THE INVENTION

1. Field of the Invention

The present invention relates to a standardized mechanical interface (SMIF) container for transferring workpieces such as reticles in a semiconductor or reticle fab, and in particular to a container including a support structure mounted for supporting the workpiece in a secure position without contacting the upper or lower surfaces of the workpiece.

2. Description of the Related Art

Semiconductor devices are made up of as many as fifty individual patterned layers of silicon, silicon compounds and metals. During fabrication of these devices, the pattern for each of these layers is contained on a mask called a reticle. A reticle is an optically clear quartz substrate on which a pattern has been formed by photolithography or other such processes. In particular, a layer of photoresist is applied on a chrome coated reticle blank. Thereafter, the pattern for a particular layer to be formed on a semiconductor wafer is transferred onto the reticle as for example by a laser pattern generator or e-beam. After pattern generation on the photoresist, the exposed portions of the photoresist are removed to leave the unwanted portions of the chrome layer exposed. These unwanted portions are then etched away. The remaining photoresist is then removed in a process which leaves the clean pattern on the surface on the reticle.

In order to keep the surface of the reticle clean, a thin transparent sheet called a pellicle is mounted a short distance away from the surface of the reticle containing the pattern. This ensures that any microscopic dust that settles on the reticle will be out of focus during the exposure process so as not to affect the pattern formed on the silicon wafer.

During fabrication of the reticle, it is important to minimize airborne particle fluxes onto the surface of the reticle on which the pattern is being formed, as any such particles can corrupt the pattern. Even after formation of the pattern and affixation of the pellicle, larger, or macro, contaminants can settle on the reticle which can interfere with pattern transference onto the semiconductor wafer. It would therefore be advantageous to shield the reticles from the external environment during reticle fabrication, during transfer of the reticle from the reticle fab to the semiconductor fab, and during usage of the reticle in the semiconductor fab.

In addition to exposing the reticle to airborne particulates, physical handling of a reticle during transfer can also damage a reticle. Common causes of damage when handling reticles include scratches, electrostatic discharge onto the reticle, and cracking of the reticle and/or pellicle.

In a semiconductor wafer fab, it is known to store and transfer workpieces such as semiconductor wafers using a standard mechanical interface, or SMIF, system. The SMIF system was developed by the Hewlett-Packard Company and disclosed in U.S. Pat. Nos. 4,532,970 and 4,534,389. The purpose of a SMIF system is to reduce particle fluxes onto workpieces such as reticles and semiconductor wafers during storage and transport of the workpieces through the fabrication process. This purpose is accomplished, in part, by mechanically ensuring that during storage and transport, the gaseous media (such as air or nitrogen) surrounding the workpieces is essentially stationary relative to the workpieces and by ensuring that particles from the ambient environment do not enter the immediate workpiece environment.

The SMIF system provides a clean environment for articles by using a small volume of particle-free gas which is controlled with respect to motion, gas flow direction and external contaminants. Further details of one proposed system are described in the paper entitled "SMIF: A TECHNOLOGY FOR WAFER CASSETTE TRANSFER IN VLSI MANUFACTURING," by Mihir Parikh and Ulrich Kaempf, Solid State Technology, July 1984, pp. 111–115.

A SMIF system has three main components: (1) sealed containers, having a minimal volume, used for storing and transporting workpieces and/or cassettes which hold the workpieces; (2) enclosures placed over access ports and workpiece processing areas of processing equipment so that the environments inside the containers and enclosures (after having clean air sources) become miniature clean spaces; and (3) a transfer mechanism to load/unload workpieces and/or workpiece cassettes from a sealed container without contamination of the workpieces from external environments.

SMIF systems have not conventionally been used in reticle fabs. The reticles are manually transferred using hand-held grippers through the various fabrication processes. Thus, the reticle is subject to the above-discussed disadvantages, namely, airborne particulates settling on the reticle, scratches, electrostatic discharge onto reticles and cracking of the reticle and/or pellicle.

In semiconductor wafer fabs, reticles are conventionally transferred in SMIF containers, or pods, configured to transfer individual or multiple reticles. The containers are in general comprised of a door which mates with a shell to provide a sealed environment in which the reticles may be stored and transferred. In order to transfer reticles between a SMIF container and a process tool within a fab, a pod is typically loaded either manually or automatedly on a load port on a front of the process tool. Once the pod is positioned on the load port, mechanisms within the port door unlatch the door from the shell so that the reticle may be transferred from within the container into the process tool.

Conventional SMIF containers include horizontal shelves along the side of the container on which an underside of the reticle is supported. Such conventional reticle SMIF containers have several disadvantages. First, it is desirable to minimize contact with the upper and lower surfaces of the reticle. Any such contact may generate particles and/or affect the pattern etched in the reticle. Additionally, it is desirable to avoid contact with vertical edges of the reticle.

A second disadvantage to conventional reticle containers is that the reticle is not securely supported in a fixed position within the container. In order to minimize movement of the reticle within the container, conventional reticle containers include vertical restraints at the front and back of the container which contact the front and back edges of the reticle to secure it in place. The front retainer moves into and out of engagement with the reticle edge when the pod shell and door are coupled and decoupled, respectively. The back vertical restraint is sloped outward away from the reticle from its bottom to top. This allows the reticle to be lifted up off of the shelves without scraping against the back restraint as it moves upward. In addition to contacting the edges of the reticle, a further disadvantage to this restraint system results from the fact that the slope of the back wall makes it difficult to provide the desired clamping force on the reticle by the front restraint upon closing the container, because such forces can cause the reticle to ride up the slope of the back restraint. Additionally, it is fairly easy for the reticle to become dislodged from between the restraints upon a shock or jolt to the container.

A still further disadvantage to conventional reticle containers is that they do not precisely control the position of a reticle in its transport container. Variation in the expected reticle position in the container may result in mishandling of the reticle or damage to the reticle as a result of unexpected contact with the reticle by a mechanism used to transport the reticle away from the container.

SUMMARY OF THE INVENTION

It is therefore an advantage of the present invention to provide a reticle container for preventing particulates and contaminants from settling on a reticle during reticle and semiconductor fabrication, and transfer of the reticle to the semiconductor wafer fab.

It is another advantage of the present invention to provide a reticle container promoting hands-off storage and transfer of a reticle.

It is a further advantage of the present invention to provide a reticle container for securely supporting a reticle during storage and transport of the reticle during reticle and semiconductor fabrication, and transfer of the reticle to the semiconductor wafer fab.

It is another advantage of the present invention to provide a reticle container in which reticles may be precisely and repeatably positioned.

It is a further advantage of the present invention to provide a reticle container allowing quick and easy positioning of the reticle at its precise position.

It is another advantage of the present invention to provide a reticle container in which a reticle may be securely held in a fixed position without contacting an upper or lower surface of the reticle.

It is a further advantage of the present invention to provide a reticle container for supporting a reticle within a container without generating particulates.

It is a still further advantage of the present invention to provide a reticle container which may be easily adapted to support reticles of different lengths and widths, as well as reticles of different thicknesses.

It is another advantage of the present invention to provide reticle containers that may be easily stacked with respect to each other for mass transport and/or storage.

It is a further advantage of the present invention to provide a reticle container capable of applying a compliant and controllable force to secure a reticle in a fixed position.

It is a still further advantage of the present invention to provide a reticle container capable of securely supporting a reticle within a container even where the container is slightly deformed.

It is another advantage of the present invention that an indicial mark located on the container and/or reticle may be visually or automatedly identified with or without opening the container.

It is another advantage of the present invention to provide a container capable of supporting and protecting a reticle during shipment from the reticle fab to the semiconductor fab.

These and other advantages are provided by the present invention which in a preferred embodiment relates to a support mechanism mounted within a transport container in which a reticle may be quickly, easily, precisely and repeatably located and removed, and which is capable of securely supporting a reticle for storage and/or transport. A preferred embodiment of the present invention includes a pair of reticle supports mounted to a door of a container. Each reticle support includes a pair of posts for supporting the four respective corners of a reticle so that a lower surface of the reticle is maintained at a fixed and repeatable position and height above the upper surface of the container door. Each corner of the reticle support includes beveled concavities having sloped surfaces at right angles to each other. When a reticle is lowered into the reticle supports, there will be a single horizontal plane where the edge of the reticle lies in contact with each sloped surface of the beveled concavities. The reticle will quickly, easily and repeatably locate in this "single solution" position as a result of the weight of the reticle and low friction between the reticle edges and surfaces of the beveled concavities.

In order to avoid contact with the vertical edges of the reticle, when a reticle is lowered into the reticle supports, the sloped surfaces of each beveled concavity engage a chamfer around a lower edge of the reticle so that the reticle is securely supported at its four corners without the reticle support coming into contact with an upper or lower surface of the reticle, or vertical edges of the reticle.

The present invention further includes a pair of reticle retainers affixed to the container shell. The retainers each include a pair of cantilevered end portions having beveled concavities inverted with respect to the beveled concavities on the reticle supports. The beveled concavities on the reticle retainers also have sloped surfaces at right angles to each other. Once a reticle is located in the reticle supports, coupling the container cover with the container door will cause the sloped surfaces of each beveled concavity to engage a chamfer around an upper edge of the reticle so that the reticle is sandwiched between the reticle support and reticle retainer at its four corners so that the reticle is held securely in position during transport of the container and/or a shock to the container. The cantilevered sections of the reticle retainer allow a compliant and controlled force to be applied by the reticle support mechanism. This compliant and controlled force serves several functions, including firmly securing the reticle within the container without excessive forces on or deformation of the reticle, even where the container may be slightly deformed.

It is a further feature of the present invention that a reticle support mechanism within a container may be easily removed and replaced by another reticle support mechanism sized to accommodate reticles having different lengths, widths and shapes. Additionally, the offset spacing between the cantilevered end sections on the reticle retainers may be varied to accommodate reticles of different thicknesses.

The present invention also contemplates locating a bar code or other indicial mark on the container, which indicial mark includes information relating to the container and/or reticle supported therein. This mark may be visually identified or identified with an automated reader system. Alternatively, known RF and IR transceiver mechanisms may be provided in the container for transmitting information relating to the container and/or reticle. It is further contemplated that an indicial mark may be located on the reticle itself. Portion(s) of the container shell and/or container door are preferably transparent so that the mark on the reticle may be visually or automatedly identified without having to remove the container shell.

BRIEF DESCRIPTION OF THE DRAWINGS

The present invention will now be described with reference to the drawings in which.

DETAILED DESCRIPTION

The present invention will now be described with reference to FIGS. 1 through 16, which in general relate to a container including a support structure for supporting a reticle. While the present invention is described with respect to a SMIF container, it is understood the present invention may be used with any of various containers for storing and transferring reticles or similar workpieces. Additionally, the present invention complies with, and allows compliance with, all applicable SEMI standards.

Figure 1:
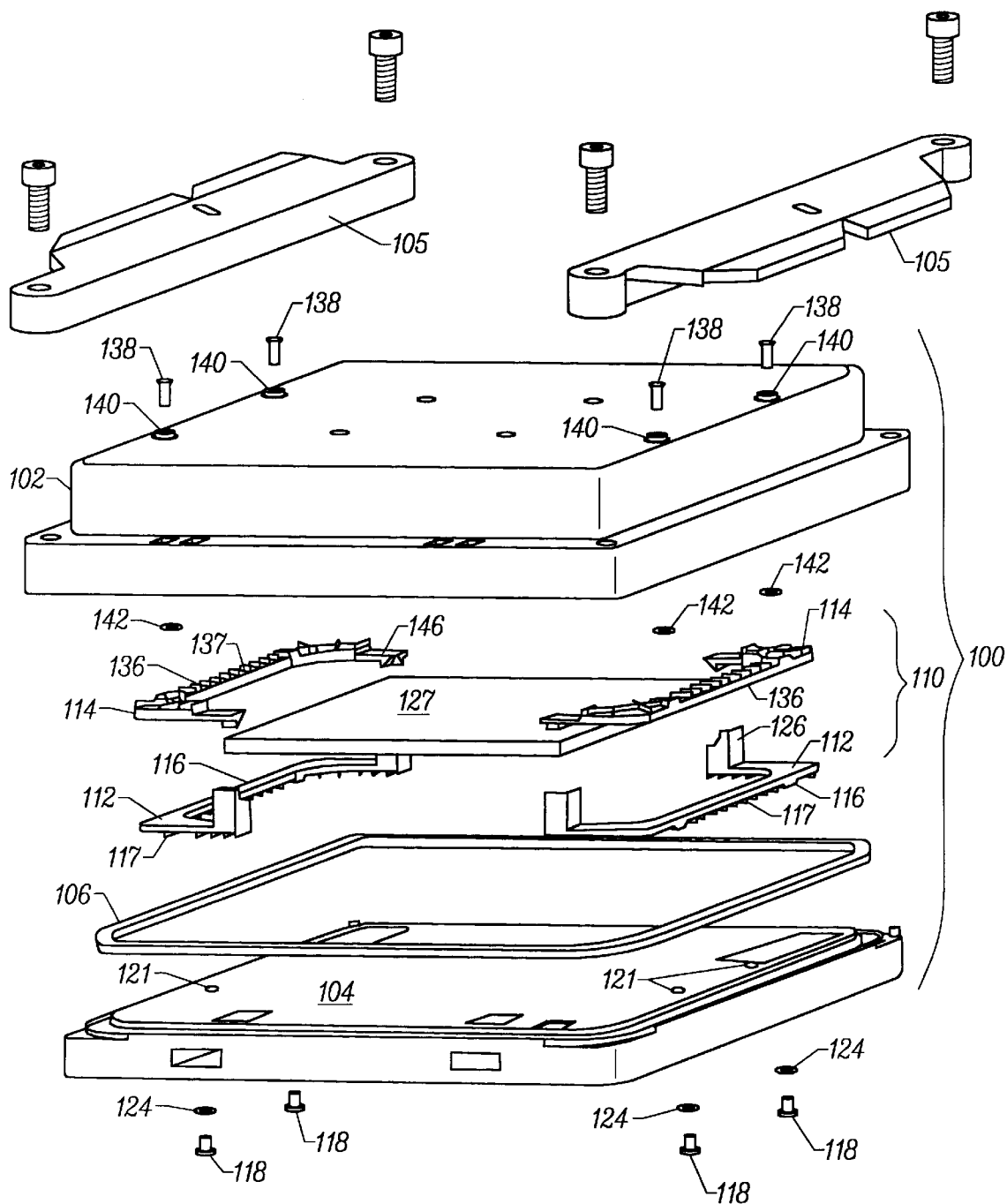
FIG. 1 is an exploded perspective view showing a container and reticle support mechanism according to the present invention.

Referring now to FIG. 1, there is shown a container 100 comprising a shell 102 capable of mating with a door 104 to define a sealed, static environment within the container. Although not shown, door 104 preferably includes a latch mechanism for allowing the shell 102 to be removably coupled to the door. Details relating to such a mechanism are shown for example in U.S. Pat. No. 4,995,430, entitled "Sealable Transportable Container Having Improved Latch Mechanism", to Bonora et al., which patent is assigned to the owner of the present application and which patent is incorporated by reference in its entirety herein. Door 104 preferably includes a gasket 106 formed of an elastomeric material provided near an outer periphery of door 104. Gasket 106 serves to form a seal between shell 102 and door 104 to prevent the flow of gas between the shell and door when coupled together. Container 100 further includes handles 105 for allowing manual or automated transfer of the container.

The container door is preferably formed of a static disapative, durable polymer, such as for example carbon fiber-filled polycarbonate. The container shell is preferably formed of a durable polymer that is clear to allow the viewing of the reticle as explained hereinafter. The shell may additionally be static disapative. An example of a transparent, static disapative material from which the shell may be formed is polymethyl methacrylate. The shell may alternatively be formed of static disapative, carbon fiber-filled polycarbonate, which is opaque, and include transparent window(s) through which the reticle may be viewed. As a further alternative, the shell may be formed of clear polycarbonate. As an alternative to polycarbonate, the door and/or shell may further be formed of flame retardant polyetherimide. It is understood that the door and shell may be formed of other materials in alternative embodiments. The door and shell are preferably formed by injection molding, but other known methods of manufacture are contemplated.

Figure 2:
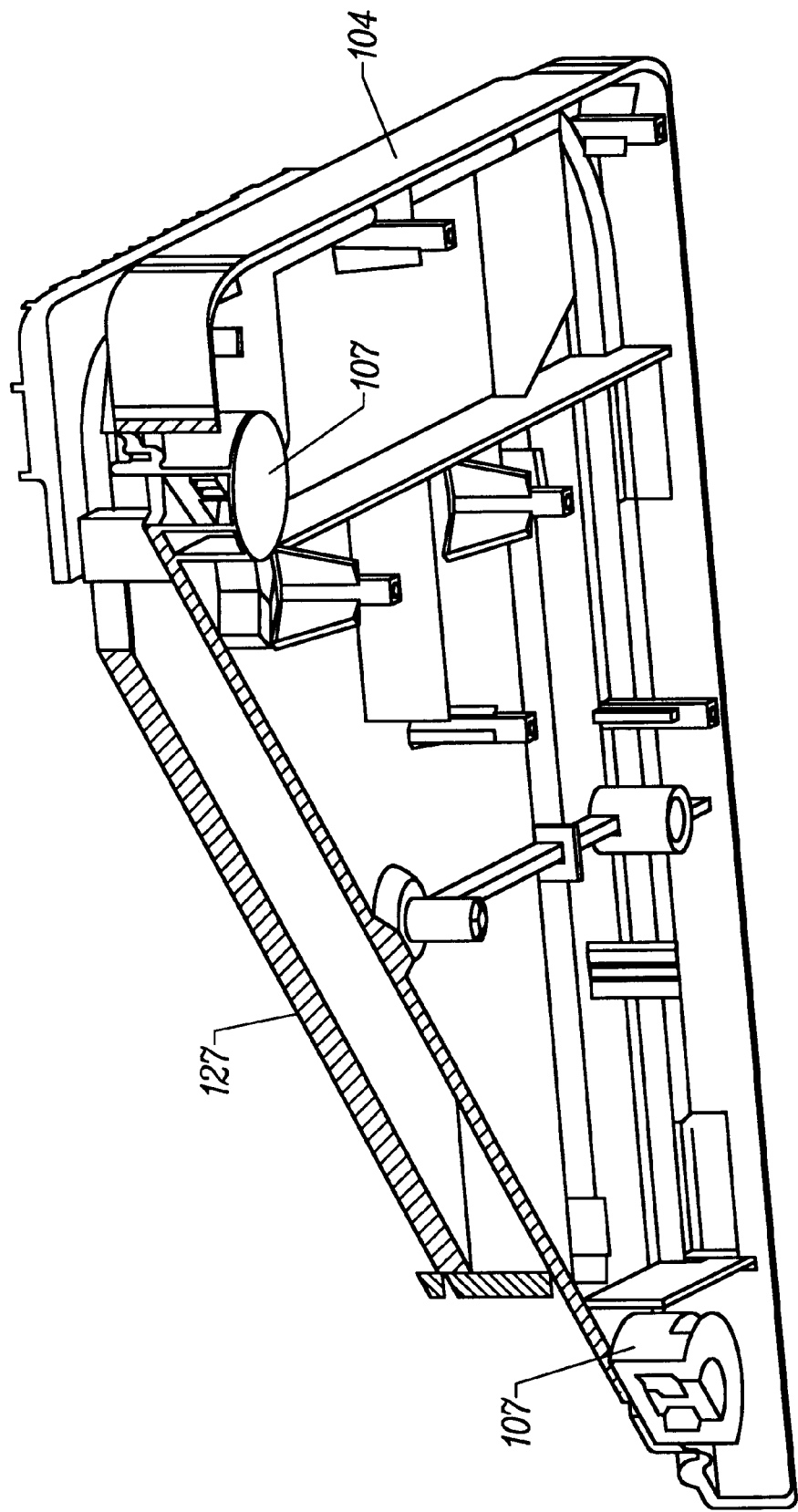
FIG. 2 is a cross-sectional bottom perspective view showing a door of a container according to the present invention.

As shown in the cross-sectional bottom perspective view of FIG. 2, in a preferred embodiment, door 104 may further include one or more valves 107 which allow fluid flow to and/or from the interior of the container. Inlet valves to the container may be connected to a pressurized gas source to fill the container with a desired gas, and outlet valves may be connected to a vacuum source to remove gas from the container. The inlet and outlet valves may be used to purge the container, including filling the container with a desired gas, and/or providing a pressure differential within the container relative to the surrounding ambient pressure. Alternatively, the valve may simply act as a breather filter to allow filtered gas flow between the container and the surrounding environment. Details relating to valves and valving systems which could be used in accordance with the present invention are set forth for example in the following patents and patent applications, each of which is assigned to the owner of the present invention and each of which is incorporated by reference herein in its entirety:

U.S. Pat. No. 4,724,874, entitled "Sealable Transportable Container Having A Particle Filtering System", to Parikh et al.;

U.S. Pat. No. 5,169,272, entitled "Method And Apparatus For Transferring Articles Between Two Controlled Environments", to Bonora et al.;

U.S. Pat. No. 5,370,491, entitled "Method And Apparatus For Transferring Articles Between Two Controlled Environments", to Bonora et al.;

U.S. Pat. No. 5,547,328, entitled "Method And Apparatus For Transferring Articles Between Two Controlled Environments", to Bonora et al.;

U.S. patent application Ser. No. 09/049,061, entitled "Evacuation-Driven SMIF Pod Purge System", to Fosnight et al.;

U.S. patent application Ser. No. 09/049,330, entitled "Kinematic Coupling Compatible, Passive Interface Seal", to Fosnight et al.;

U.S. patent application Ser. No. 09/049,354, entitled "Modular SMIF Pod Breather, Adsorbent, and Purge Cartridges", to Fosnight et al.; and U.S. patent application Ser. No. 09/204,320, entitled "Passively Activated Valve for Carrier Purging", to Fosnight et al.

Figure 3:
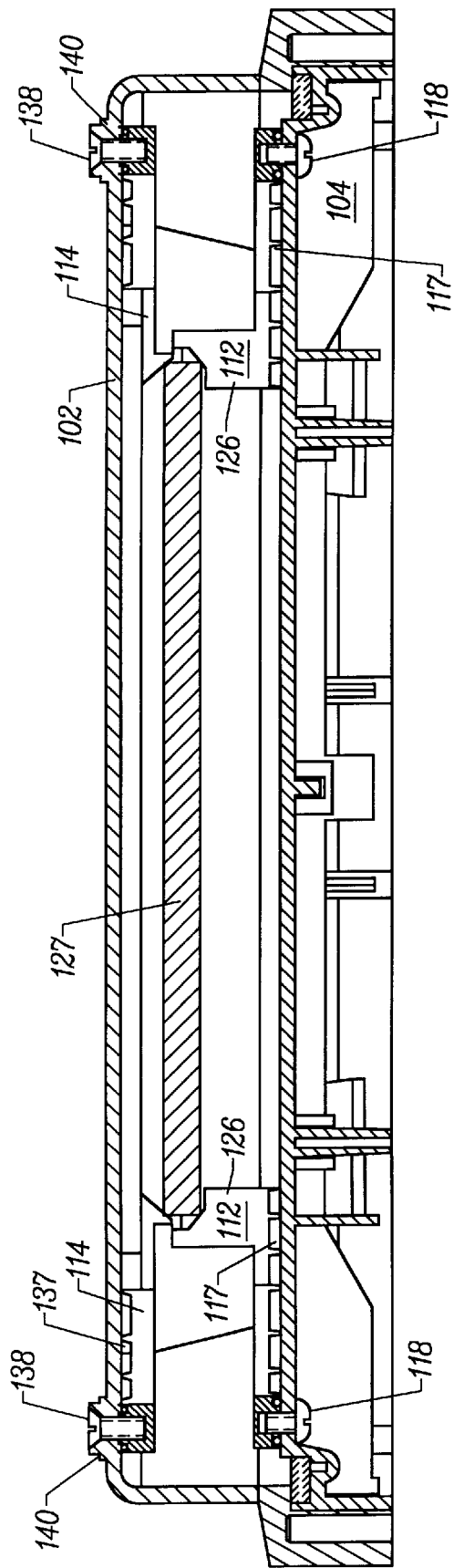
FIG. 3 is a cross sectional side view showing a container and reticle support mechanism according to the present invention.

Referring now to FIGS. 1 and 3, container 100 further includes a reticle support mechanism 110 mounted within an interior of the container 100. Reticle support mechanism 110 includes a pair of reticle supports 112 mounted to door 104 and a corresponding pair of reticle retainers 114 mounted to shell 102. As set forth hereinafter, supports 112 and retainers 114 of the reticle support mechanism 110 allow a reticle to be quickly and easily positioned within and removed from container 100, and also prevent movement of the reticle within the container during container transport. In a preferred embodiment, the reticle supports 112 and retainers 114 are formed of a substantially rigid, low particulating and statically disapative material such as for example carbon fiber-filled polyetheretherkeytone ("PEEK"). It is understood that various other materials including polycarbonate, polyetherimide, or other compositions may be used.

Figure 4:
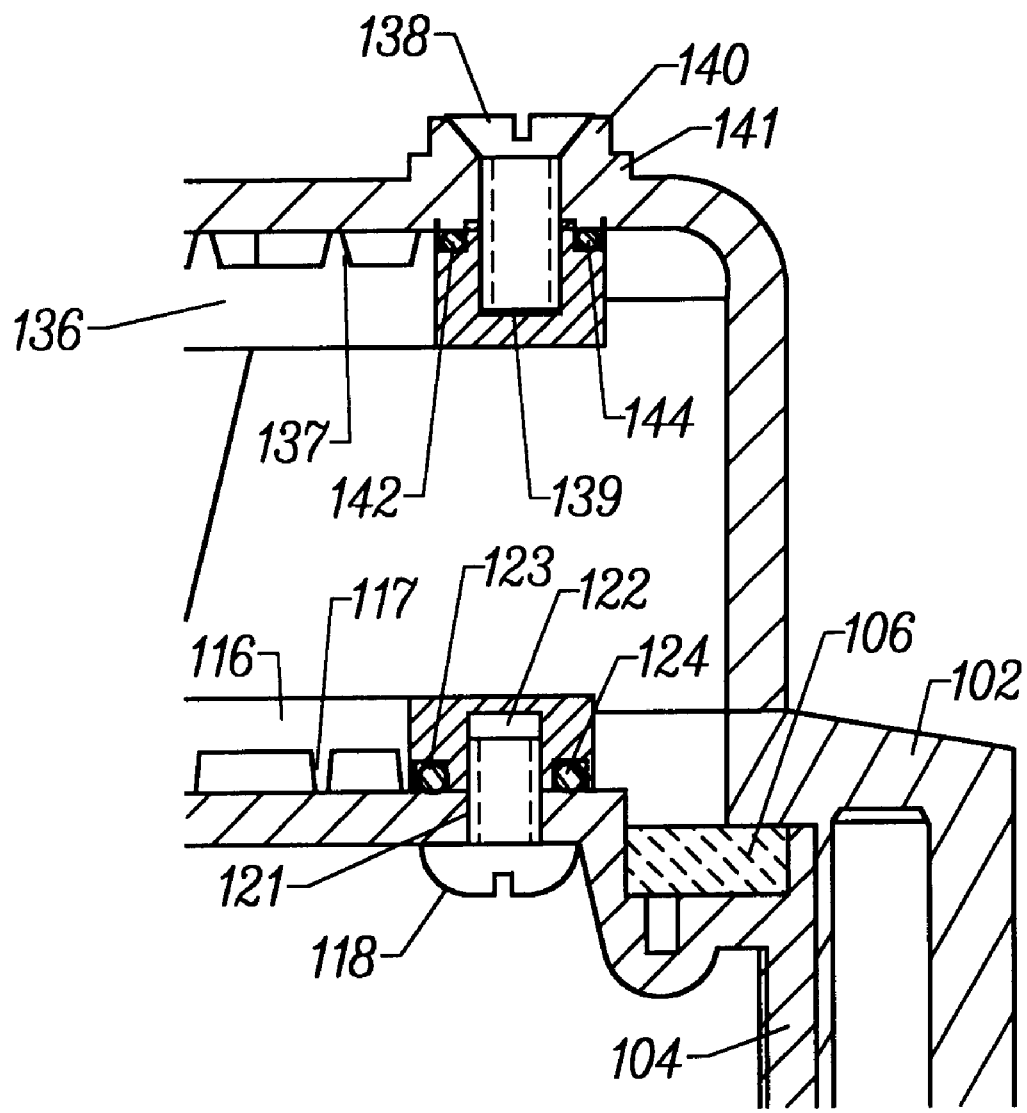
FIG. 4 is an enlarged partial cross-sectional side view of the container and reticle support mechanism according to the present invention.

Referring now to FIGS. 1, 3 and 4, the reticle supports 112 mounted to door 104 each includes a base portion 116 fixedly mounted to door 104. The base portions may include one or more registration pins (not shown) on their bottom surface that fit down into cylindrical depressions in the door to properly align the supports on the door. Each of the base portions 116 are affixed to the door 104 by screws 118 which fit within a number of holes 121 through the upper surface of the door. The screws 118 fit up through the door 104 and into threaded holes 122 formed in base portion 116. The base portion 116 may include a channel 123 surrounding holes 122 for receiving O-rings 124. The O-rings provide an air tight seal between the reticle supports 112 and the door 104 to prevent the leakage of gas into or out of the container at each of the screw locations.

The base portions 116 are preferably spaced a small distance from the door by a grid of standoffs 117. The standoffs prevent cleaning solution from getting trapped between the base portions 116 and container door 104 by capillary action, which trapped solution would be the source of contaminants to the reticle. This makes it easier to clean the container door. In an alternative embodiment, it is contemplated that the standoffs 117 and O-rings 124 be replaced with a larger, non-circular O-ring located underneath the base portions 116, along the outer periphery of base portions 116. Such a seal would prevent cleaning solution from getting trapped between the base portions 116 and container door 104.

Figure 5:
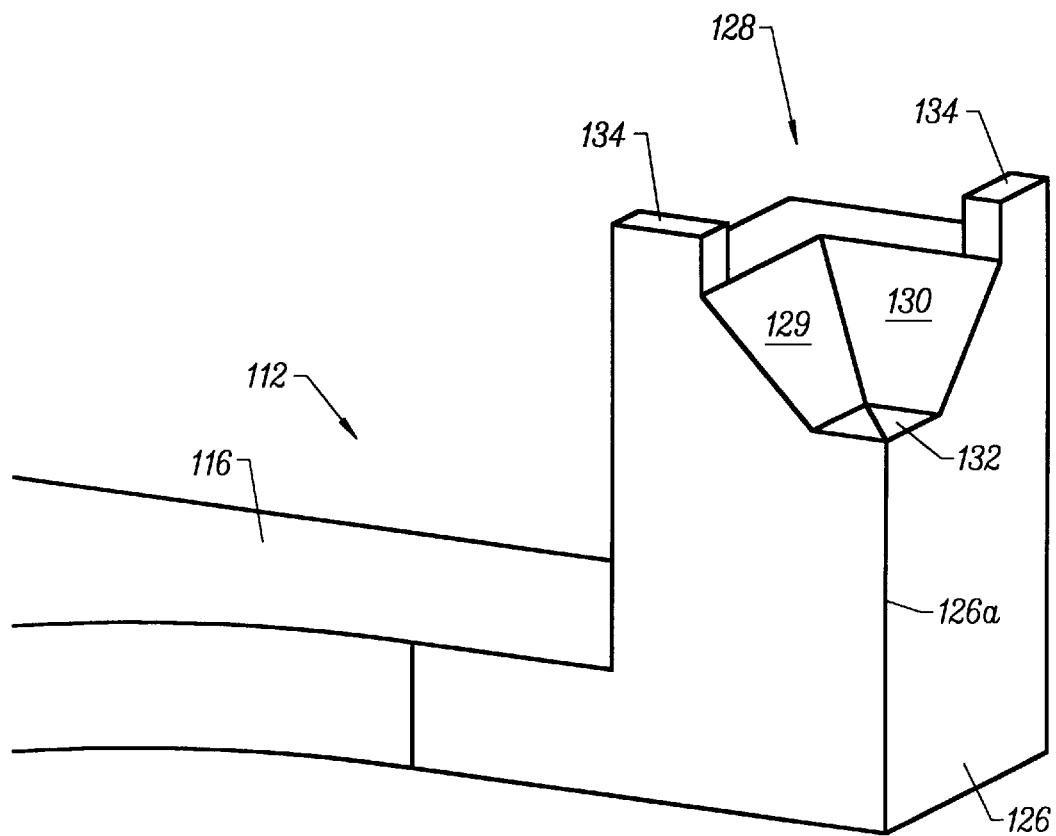
FIG. 5 is an enlarged partial perspective view of a reticle support according to the present invention.
Figure 6:
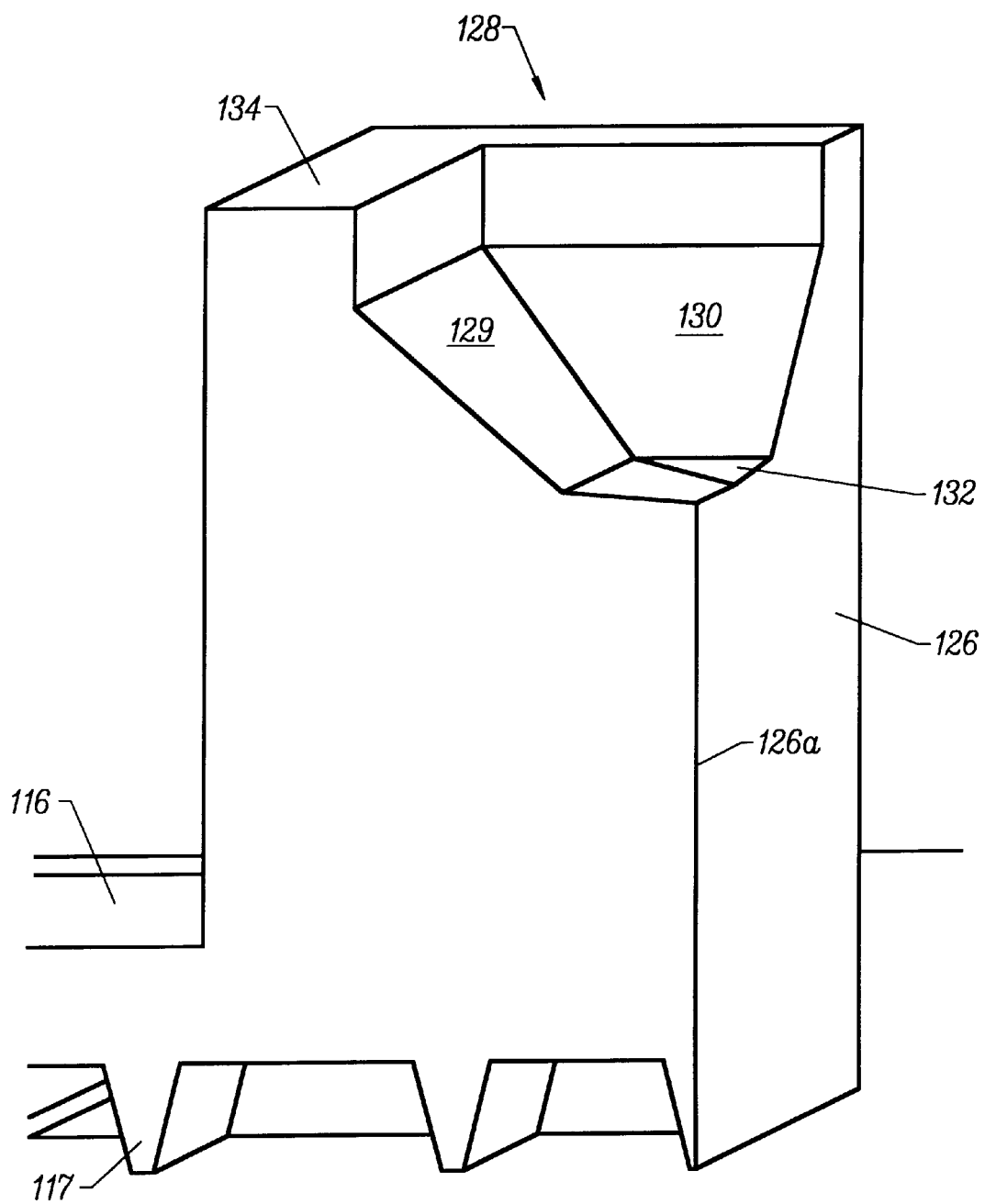
FIG. 6 is an enlarged partial perspective view of a reticle support according to an alternative embodiment of the present invention.
Figure 7:
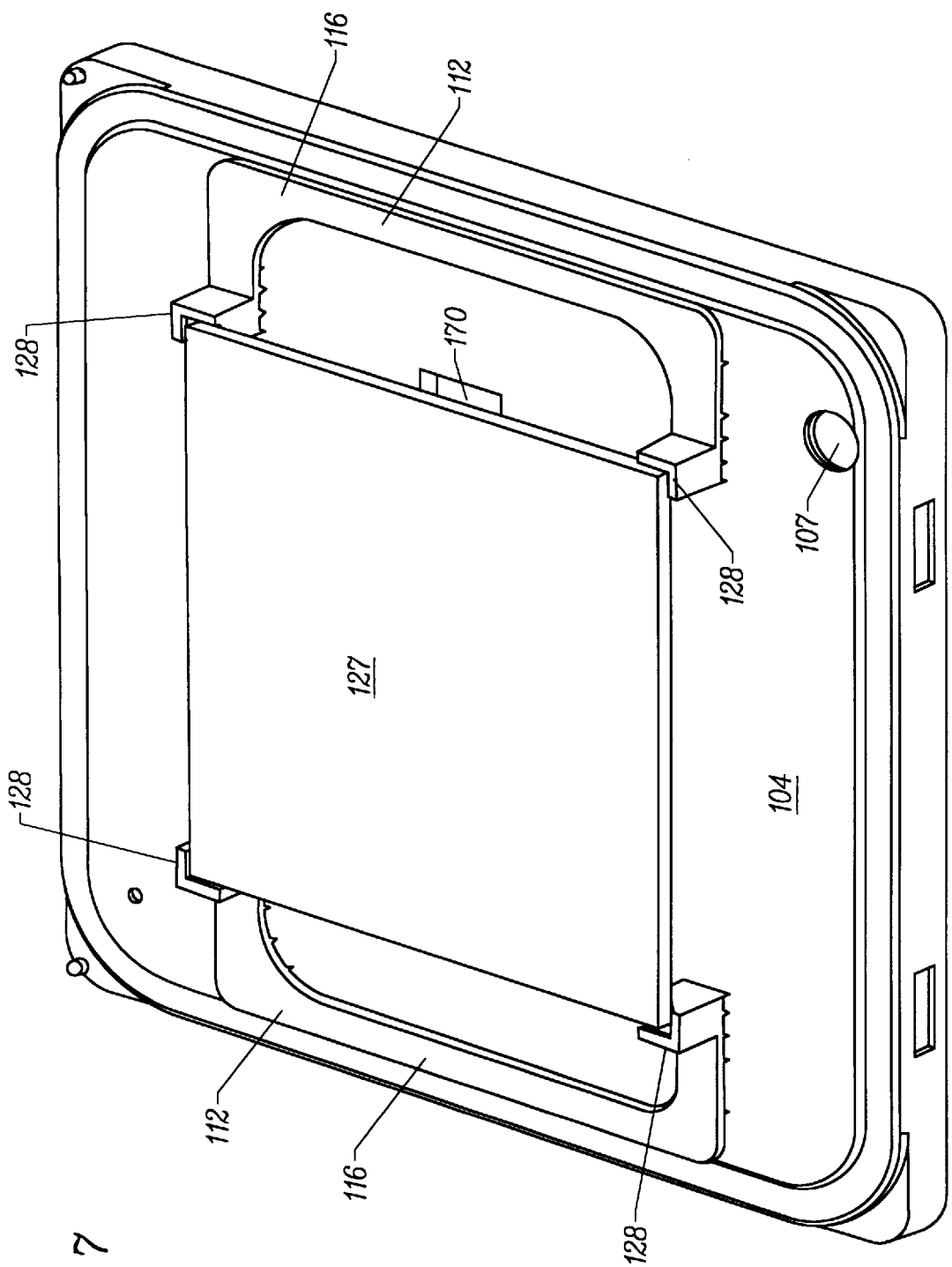
FIG. 7 is a perspective view of the container door and reticle supports according to the present invention supporting a reticle.

Referring now to FIGS. 1, 3 and 5, each reticle support 112 further includes a pair of posts 126 for supporting a reticle 127 at a fixed height above the upper surface of container door 104. In a preferred embodiment, the bottom surface of reticle 127 will always be maintained 14.4mm above the surface of door 104. Referring to FIGS. 5 and 6, in order to support the reticle, the top of each post 126 includes a beveled concavity 128. Beveled concavity 128 includes a pair of sidewalls 129 and 130 which are sloped inward (i.e., toward a center of the container) from their top to bottom and which form right angles with each other in a horizontal plane.

A chamfer is conventionally provided around a lower edge of reticle 127. The sloping sidewalls 129 and 130 of each beveled concavity 128 are provided for supporting the reticle at its corners so that the chamfer at adjoining sides of reticle 127 lies in contact with walls 129 and 130, respectively. Thus, the reticle support 112 supports the reticle without any portion of the support 112 coming into potentially harmful contact with a bottom surface or vertical edge of the reticle. In a preferred embodiment, the slope of sidewalls 129 and 130 have the same angle as the chamfer in the reticle, which is preferably about 45°. It is understood that this angle may vary in alternative embodiments.

Horizontal planes taken from the top to the bottom of the beveled concavities 128 define the four corners of successively smaller and smaller quadrangles. There will be a single such horizontal plane where the spacing between the angled sidewalls of the respective beveled concavities will precisely match the dimensions of the reticle 127. Thus, the reticle will lower into the beveled concavities until it attains this "single solution" horizontal plane, shown for example in FIG. 7. In this position, there is engagement between the chamfered edges of the reticle and each of the sidewalls of each beveled concavity to establish a secure, horizontal and stable position of the reticle within the reticle supports 112. In the event one corner or side of the reticle 127 is initially lower than the others, the weight of the reticle and the relatively low friction between the chamfered reticle edges and the sidewalls will automatically cause the reticle to shift to the single solution position. Thus, the resting place of the reticle 127 within the reticle supports 112 will be easily, quickly, precisely and securely established for a given sized reticle each time the reticle is seated on the reticle supports.

Each post 126 further includes a tilt limiting section 132 and stopper projections 134. When a reticle is being loaded onto or removed from the reticle supports 112, it may happen that one corner or one side of the reticle will dip below the opposite corner or side of the reticle. Tilt limiting section 132 is provided to limit the extent to which a corner or side of reticle 127 can dip during loading or removal of a reticle from the supports 112. Tilt limiting section 132 is preferably provided at a slight angle, such as for example 5° with respect to the horizontal, with a lowermost portion of the tilt limiting section 132 being located adjacent to a corner 126a of post 126. This ensures that, even where the reticle rests on the tilt limiting section 132, the support 112 will not come into contact with a bottom surface of the reticle. It is understood that the angle of tilt limiting section 132 may vary in alternative embodiments, and additionally, because the reticle will be tilted in the event it does come into contact with tilt limiting section 132, tilt limiting section 132 may be horizontal in alternative embodiments without contacting the bottom surface of the reticle.

In the event that a side of a reticle is tilted downward within beveled concavities 128, the opposite side of the reticle will ride up in its beveled concavity in the reticle support 112. As such, each of the posts 126 further include stopper projections 134. The stopper projections may be a pair of raised rectangular sections at the corners of each beveled concavity (as shown for example in FIG. 5). Alternatively, the stopper projections may comprise a continuous raised wall around each beveled concavity (as shown for example in FIG. 6). Even if one corner is tilted downward so that it rests against the tilt limiting section 132, the stopper projections 134 prevent the opposite corner from slipping out of its beveled concavity, and also prevent the reticle from falling off the tilt limiting sections 132. The tilt limiting sections 132 and stopper projections 134 together prevent a reticle from dropping or sliding out of its position within respective beveled concavities 128 upon loading or removal of a reticle.

The stopper projections 134 further prevent the reticle from being displaced from the reticle supports in the event a moment force is applied to the reticle tending to rotate the reticle up and out of the angled sidewalls 129 and 130. In particular, referring to FIGS. 8–10, there is shown a reticle 127 which has been acted upon by an inadvertent force in the direction of arrow A. The force has caused the reticle to rotate in the direction of arrow B, up and out of the angled sidewalls 129 and 130. According to an aspect of the present invention, diametrically opposed portions of stopper projections 134 are spaced apart a distance slightly less than the diagonal of the reticle. Thus, in the event the reticle is rotated up and out of the angled sidewalls, diagonal portions of the reticle will engage portions of the projections 134 as shown in FIGS. 8 and 10, and the reticle will be prevented from falling out of the reticle supports.

Figure 8:
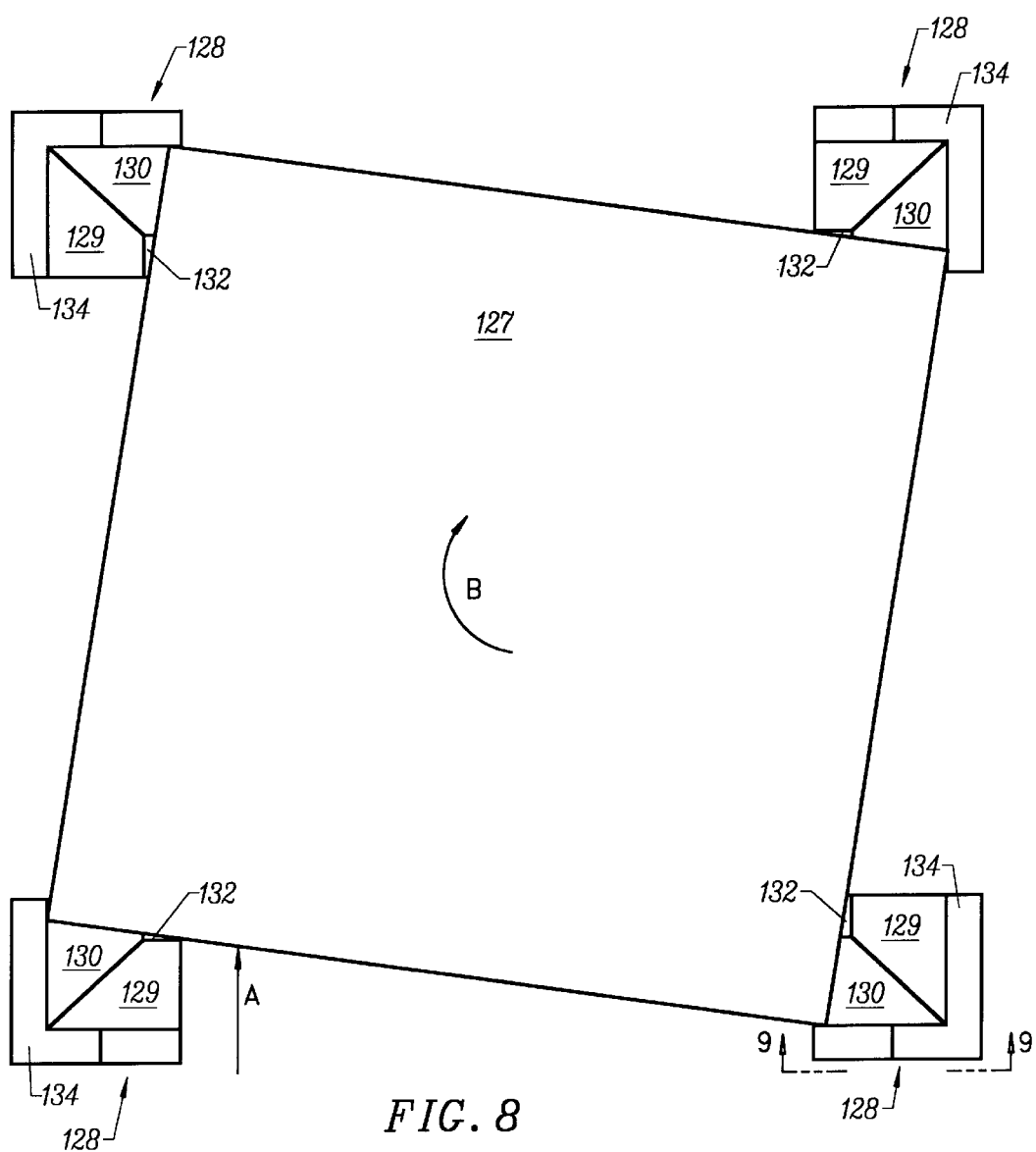
FIG. 8 is a top view of reticle supports preventing a reticle from being rotated out of the supports.
Figure 9:
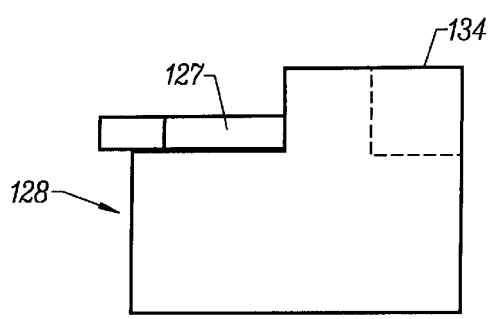
FIG. 9 is a side view through line 9—9 of FIG. 8.
Figure 10:
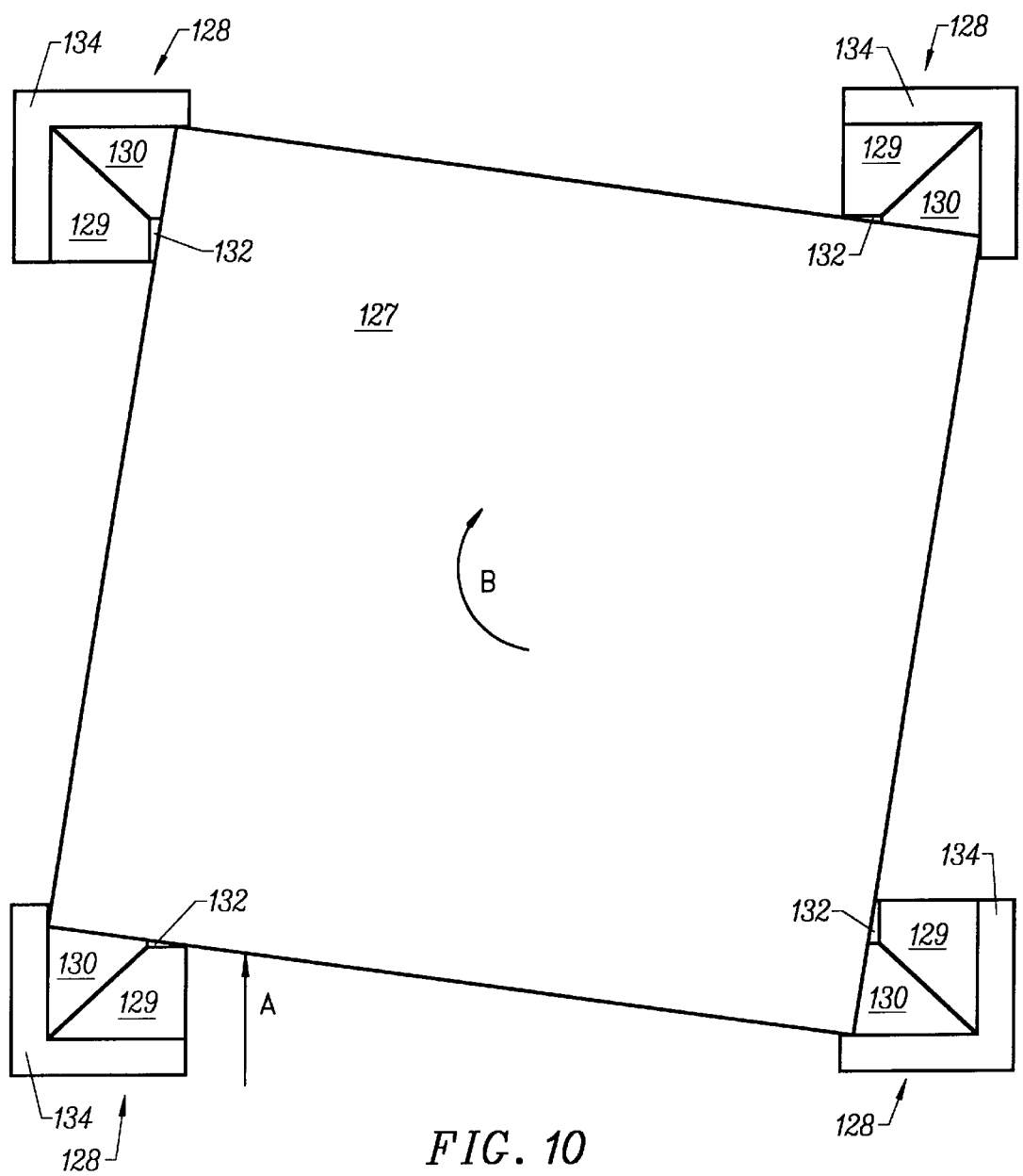
FIG. 10 is a top view of reticle supports preventing a reticle from being rotated out of the arts according to an alternative embodiment.

As shown in the embodiment of FIGS. 8 and 9, the projections 134 may be shortened on one side of each beveled concavity 128. Thus, when the reticle rotates clockwise, only the projections on the beveled concavities at the lower left and upper right as shown on FIG. 8 will restrain the reticle. If the reticle were to rotate counterclockwise, only the projections on the beveled concavities at the upper left and lower right as shown on FIG. 8 will restrain the reticle. Alternatively, the projections may extend around the entire beveled concavity as shown in FIG. 10. It is understood that embodiments of the present invention where the projections 134 comprise a pair of rectangles as shown in FIG. 5 function in the same manner to prevent the reticle from rotating out of the supports 112.

The reticle retainers 114 of the reticle support mechanism 110 will now be described with reference to FIGS. 1, 3, 4 and 11. Each of the reticle retainers 114 includes a base portion 136 which is mounted to container shell 102. The base portions may include one or more registration pins (not shown) on their upper surface that fit up into bosses formed in the interior of the shell to properly align the retainers on the shell. An upper surface of shell 102 preferably includes four bosses 140 for receiving a like number of screws 138 so that when fastened, the tops of screws 138 are flush with a top of boss 140. The screws 138 fit through boss 140 and into a threaded hole 139 formed in the base portion 136. O-rings 142 may further be provided within respective channels 144 formed in the reticle retainers to prevent the flow of gas through the hole defined by boss 140 once the reticle retainers 112 are mounted to the container shell 102.

As described above with respect to the mounting of base portions 116 on door 104, it is contemplated that the base portions 136 may be spaced from the shell by a grid of standoffs 137. The standoffs prevent cleaning solution from getting trapped between the base portions 136 and container shell by capillary action, which trapped solution would be the source of contaminants to the reticle. This makes it easier to clean the container shell. In an alternative embodiment, it is contemplated that the standoffs 137 and O-rings 142 be replaced with a larger, non-circular O-ring located between the base portions 136 and the shell 102, along the outer periphery of base portions 116. Such a seal would prevent cleaning solution from getting trapped between the base portions and shell.

Figure 11:
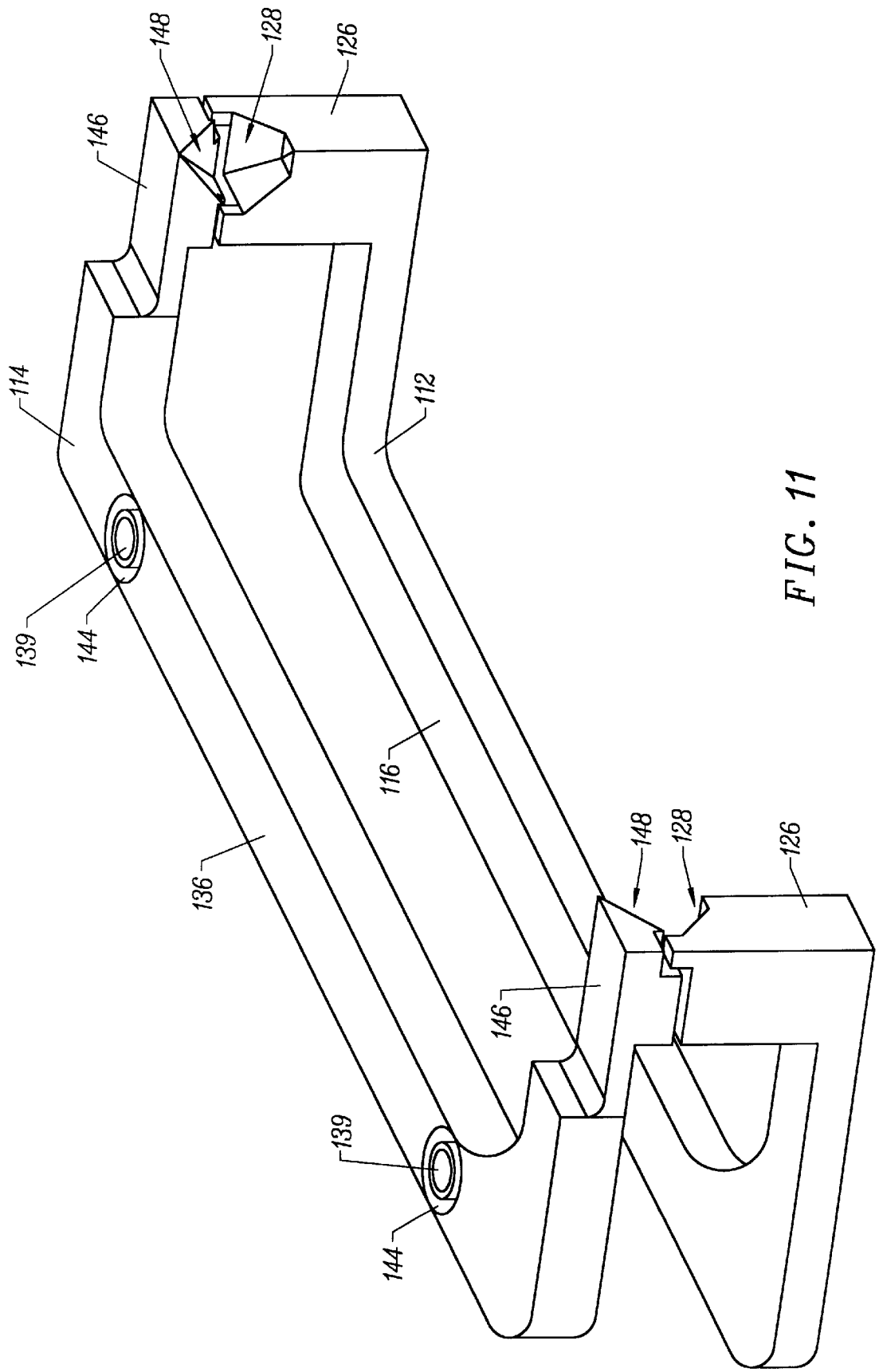
FIG. 11 is a perspective view of a reticle support and reticle retainer as they would be positioned in a sealed container.
Figure 12:
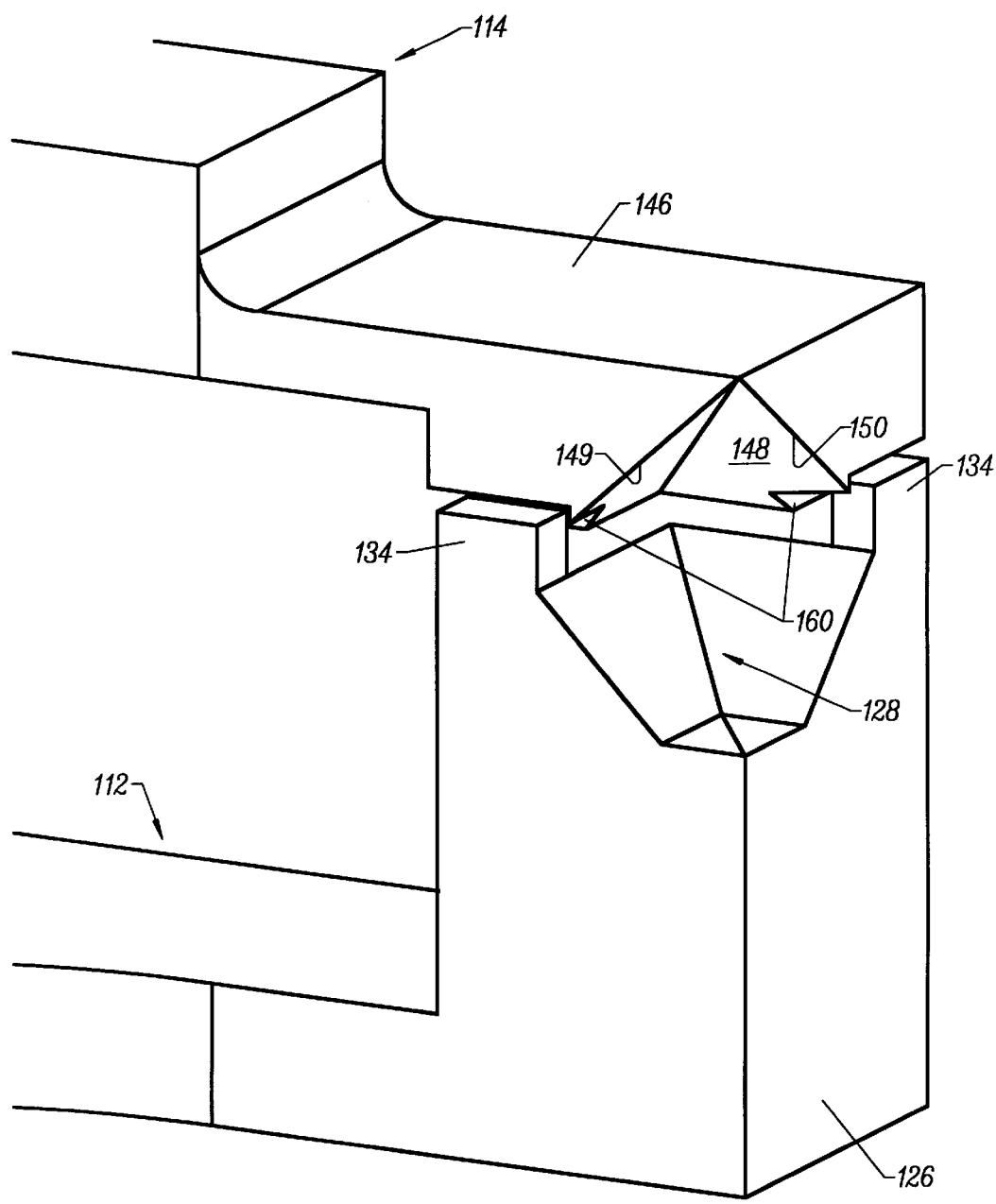
FIG. 12 is an enlarged partial perspective view of a reticle support and reticle retainer as it would be positioned in a coupled container.

FIGS. 11 and 12 show the positioning of the reticle support 112 and reticle retainer 114 when the container shell 102 is coupled to the container door 104 (the shell 102 and door 104 have been omitted from FIGS. 11 and 12 for clarity). Each of the reticle retainers 114 includes a cantilevered section 146 affixed to the ends of base portion 136. The ends of each of the cantilevered sections 146 include a beveled concavity 148 which is inverted with respect to the beveled concavity 128 on each of the posts 126 of the reticle supports 112. Beveled concavity 148 includes a pair of sidewalls 149 and 150 which are sloped outward (i.e., away from a center of the container) from their top to bottom and which form right angles with each other in a horizontal plane.

A chamfer is conventionally provided around an upper edge of reticle 127. The sloping sidewalls 149 and 150 of each beveled concavity 148 are provided for engaging the reticle at its corners when the container shell is coupled to the container door to sandwich the reticle between the reticle support 112 and the reticle retainer 114. The sidewalls 149 and 150 of each beveled concavity 148 contact the chamfer along the top edge of the reticle, so that no portion of reticle retainer 114 comes into potentially harmful contact with the upper surface of the reticle or vertical edges of the reticle. In a preferred embodiment, the slope of sidewalls 149 and 150 have the same angle as the chamfer in the reticle, which is preferably about 45°. It is understood that this angle may vary in alternative embodiments. It also contemplated that, instead of chamfered edges, the reticle may have rounded edges. In this event, the angled side walls of the reticle support and reticle retainer will operate to engage the rounded edge to support and retain the reticle.

Cantilevered sections 146 further include indentations 160 which receive without contact the stopper protrusions 134 so that each beveled concavity 148 of the retainers 114 may be positioned close to each beveled concavity 128 of the supports 112, with the reticle 127 therebetween, without interference. In embodiments where the stopper protrusions comprise a continuous raised wall around each beveled concavity 128 as shown in FIG. 6, the indentations 160 would similarly be configured so as not to interfere with the protrusions upon coupling of the container shell with the door.

Without the benefits provided by the compliancy of cantilevered sections 146, when the shell was coupled to the door, the full force exerted by the container latching mechanism in the door would be exerted directly onto the reticle through the reticle retainers. This could result in a deformation or breaking of the reticle if the force was too great. Furthermore, where the door and/or shell are deformed, or where the reticle was not properly seated in the supports, the cantilevered sections in engagement with the reticle could prevent the container shell from being properly coupled to the container door.

However, according to a further aspect of the present invention, cantilevered sections 146 are capable of flexing slightly with respect to base portion 136. Thus, the beveled concavities 148 of the reticle retainer 114 may be positioned to contact the upper chamfer of reticle 127 just prior to the container top being completely seated on the container door. The final positioning of the container top on the container door will cause the cantilevered sections 146 to flex slightly and exert a compliant force downward on the upper chamfer in the reticle 127. In a preferred embodiment, the cantilevered portions 146 may be configured so that the cantilevered sections together exert a compliant force downward on the reticle approximately equal to three times the weight of the reticle. It is understood that the force exerted by each of the cantilevered portions may vary in alternative embodiments.

The compliant force exerted by the cantilevered sections 146 serves several functions. First, although the reticle will normally seat to its single solution position automatically, it may happen that a nick or some other irregularity exists in a sidewall of the beveled concavity 128, which nick or irregularity prevents the reticle from automatically seating in its single solution position. In this event, the force exerted by the cantilevered section may gently push the reticle to its proper single solution position. Alternatively, in the event that the reticle is securely stuck in a nick or irregularity, the cantilevered sections will not force the reticle down to its single solution position so as to damage or break the reticle. Instead, the cantilevered section will flex, providing an opportunity for the reticle to be freed from the nick (as opposed to simply being driven down further into the nick as in conventional systems). In the event the reticle does not dislodge from the nick, the cantilevered sections will flex to accommodate the position of the reticle.

A further function of the cantilevered sections is provide a steady, controlled force on the reticles which is provided so as not to deform the reticle over prolonged periods of time.

A still further function of the cantilevered sections is to allow sealing of the container even where the container shell or door is deformed, or where the reticle is not fully seated in its single solution position. Where the shell or door is deformed, or the reticle not properly seated, the cantilevered section may engage the reticle before the shell is properly engaged with the door. However, because the force is controlled and compliant, the cantilevered sections will flex to allow the latching mechanism to properly couple the container shell to the door. In this regard, the force exerted by the cantilevered sections is preferably less than that exerted by the container latching mechanism to latch the shell to the door.

The shell 102 need only be coarsely aligned with the container door 104 as the shell is lowered into engagement with the door. The reticle retainer has adequate lead-in for any tolerances between the container door and shell. The angle of the sidewalls in the beveled concavities 148 provides tolerances of approximately 3 mm front to back and side to side. This tolerance may vary in alternative embodiments.

Figure 13:
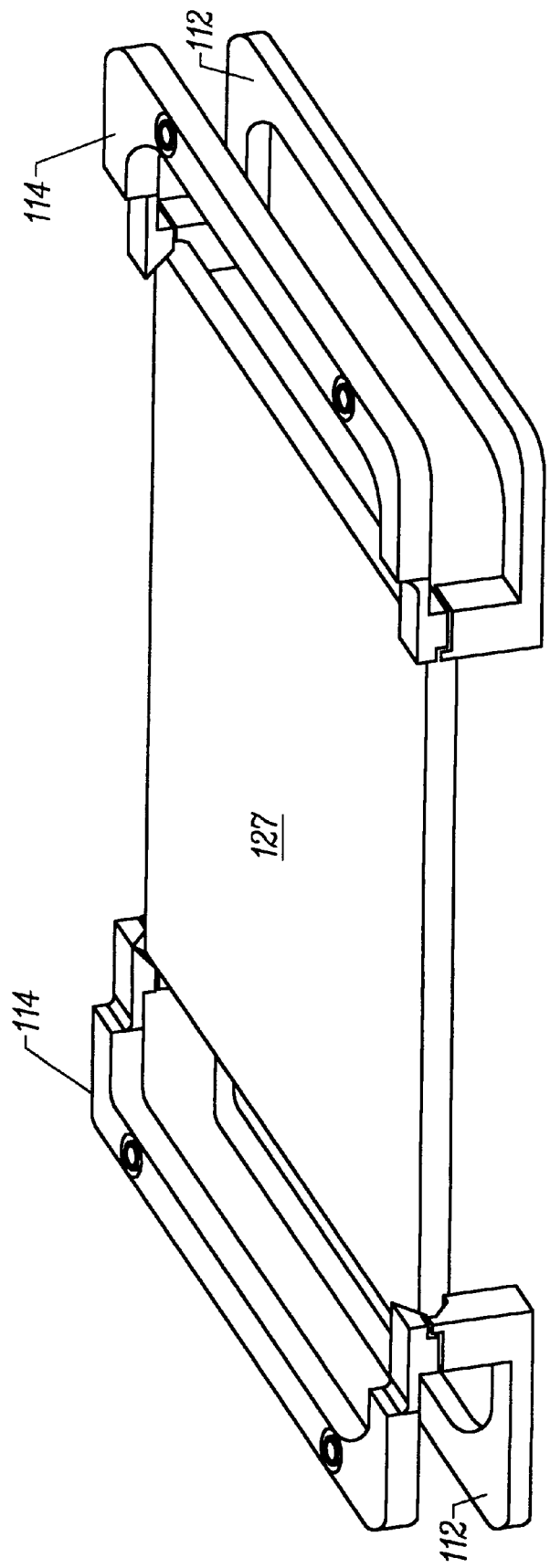
FIG. 13 is a perspective view of a reticle support and reticle retainer supporting a reticle as they would within a sealed container.
Figure 14:
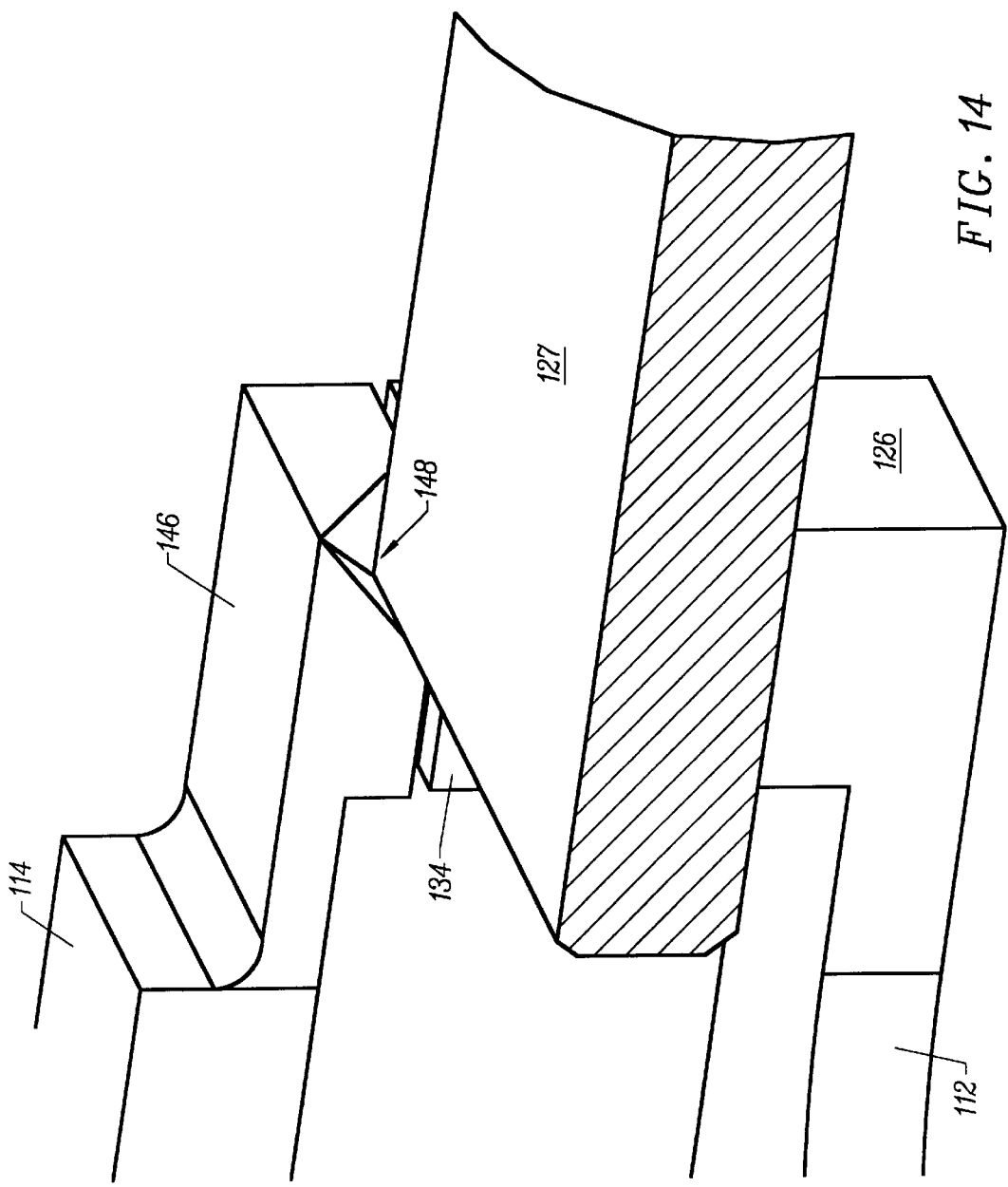
FIG. 14 is an enlarged partial perspective view showing a reticle support and reticle retainer supporting a reticle as they would within a sealed container.
Figure 15:
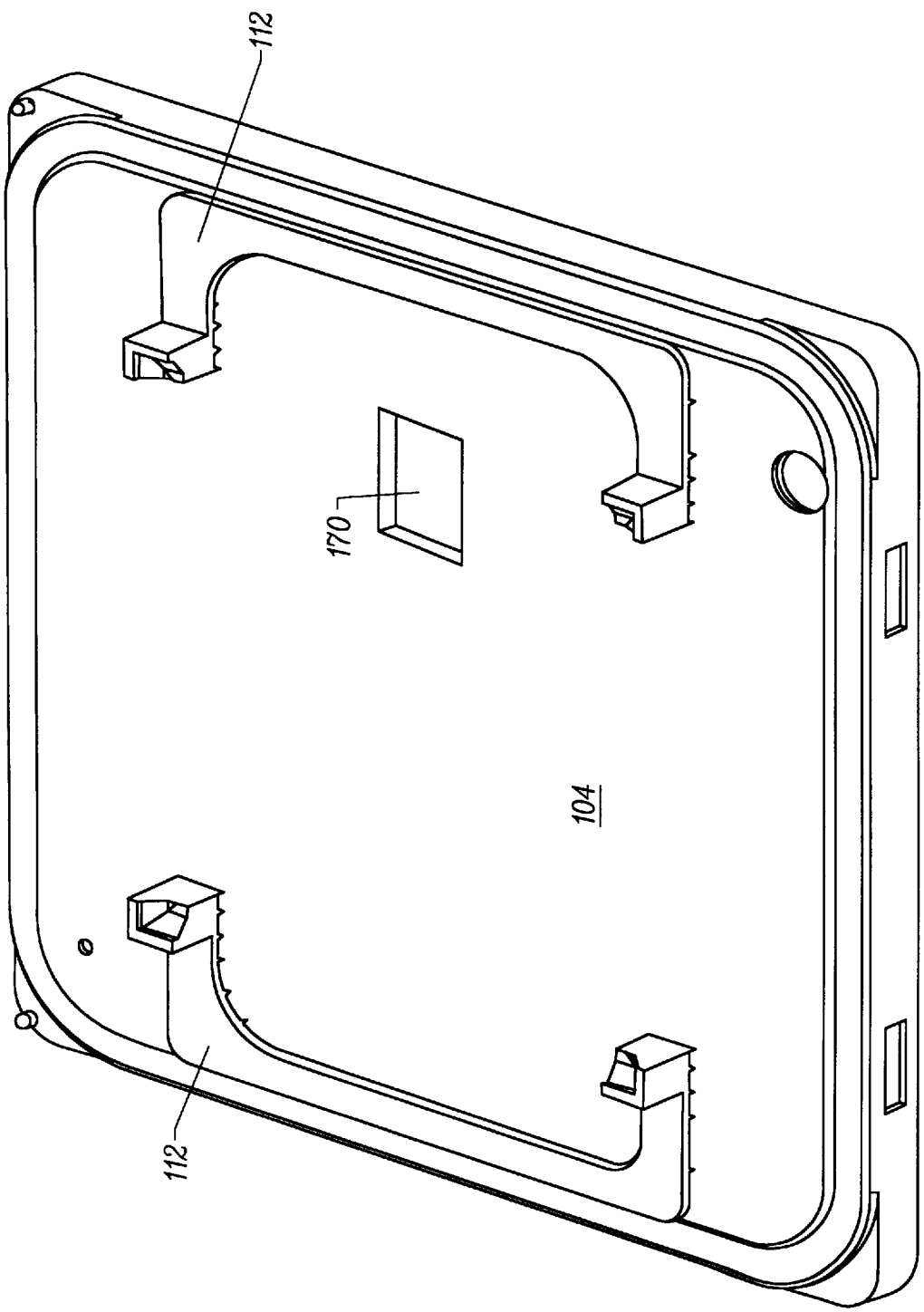
FIG. 15 is a perspective view of a door including a viewing window according to the present invention.

As shown in FIGS. 13 and 14, when the container shell 102 is coupled to the container door 104 (omitted from FIGS. 13 and 14 for clarity), the reticle 127 is sandwiched between the beveled concavity 128 on reticle supports 112 and the beveled concavity 148 on reticle retainers 114 at each corner of the reticle. It is a further feature of the present invention that the cantilevered sections 146 allow the reticle to be held securely between the support 112 and retainer 114 even where the container is deformed.

Reticles come in various sizes, such as for example 5", 6", 7", 8" and 230 mm, as well as various thicknesses, such as for example 0.15", 0.25" and 9 mm. As such, according to the present invention, it is understood that the reticle supports 112 and retainers 114 may be configured to support different sized reticles, including at least those reticle sizes set forth above. The attachment points of the reticle supports and retainer to the door and shell, described above, are preferably the same for each configuration. Thus, the location of the base portions 116 and 136 of the reticle support and retainer, respectively, will always be mounted in the same location, near to the sides of the door and shell so as to accommodate large reticles and not intrude on the space between the bottom of the reticle and the door which must be left clear to allow access to the reticle by an end effector. The positions of the posts 126 relative to base portions 116, and the positions of the cantilevered sections 146 relative to base portions 136, will vary to accommodate various size reticles. Where it is desired to change the size of a reticle to be stored and/or transferred in a container, the first reticle support mechanism 110 may be easily removed by removing the screws 118 and 138, and then attaching the reticle support mechanism 110 configured for the new reticle using the same screws 118 and 138.

Additionally, by varying the offset of the cantilevered portions 146 relative to the base portions 136 on the reticle retainer 114, the reticle support mechanism according to the present invention may support reticles of different thicknesses. Alternatively, the height of any standoffs provided for spacing the base portions 136 from the shell may be varied to accommodate reticles of varying thicknesses. By standard, the distance of the lower surface of the reticle is always 14.4 mm from the upper surface of the container door. However, it is understood this height may be varied by varying the height of posts 126.

Although not critical to the present invention, handle 105 may be color coded to indicate a particular size, thickness and/or configuration of the reticle support mechanism 110. Thus, when the reticle support mechanism 110 within a container is changed, the handle 105 would also be changed to the color corresponding to the newly inserted reticle support mechanism 110.

Container 100 may include a bar code or other indicial mark including information relating to the container 100 and/or reticle 127 therein. Such bar codes and indicial marks may be read by an automated reader system. As an alternative to bar codes and markings, the container 100 may include an RF pill including a transponder for transmitting information relating to the container and/or reticle therein. Such RF pills, and systems making use thereof, are described for example in U.S. Pat. Nos. 4,827,110 and 4,888,473 to Rossi et al., and U.S. Pat. No. 5,339,074 to Shindley. The container may alternatively include an IR tag. Such IR tags, and systems making use thereof, are described for example in U.S. Pat. Nos. 5,097,421, 4,974,166 and 5,166,884 to Maney et al. Each of the above-identified patents is assigned to the owner of the present invention, and each is incorporated by reference in its entirety herein.

In addition to providing a bar code or indicial mark on the outside of the container, an indicial mark may also be provided on the reticle itself. At least the top of shell 102 is preferably flat and clear so that the indicial mark on the reticle under the shell 102 may be visually and/or automatedly identified. It is further contemplated that at least a portion of a top of the door (i.e., the surface of the door nearest the interior of the container) include a window 170 (FIGS. 7 and 15) formed of a clear material, and that a through hole be provided in the door beneath the window to allow visual and/or automated identification of an indicial mark on the reticle from underneath the container 100.

It is a further feature of the present invention that multiple containers 100 may be stacked with respect to each other. In particular, a bottom surface of door 104 may include annular recesses (not shown) for seating snugly over bosses 140 (FIG. 4). Thus, a plurality of containers 100 may be stacked and stored or transported all at once. A shoulder 141 may be provided on boss 140 to prevent the annular recesses from seating directly on the surface of the container shell 102.

Although the present invention has been described thus far as supporting a square or rectangular reticle, it is understood that the present invention may be used to firmly support other workpieces within a container during storage and transport, such as for example x-ray masks.

Additionally, it is understood that the workpiece may be round or curvilinear. In such an embodiment, the respective beveled concavities would be modified to replace the angled sidewalls with continuously curved sidewalls configured to match the outer circumference of the workpiece.

Furthermore, although the present invention has been described thus far as supporting a reticle at its corners, it is understood that the portions of the reticle support 112 and reticle retainer 114 may be moved away from the corners so as to support a reticle along its sides. In this embodiment, each of the beveled concavities in the reticle support 112 would be replaced by a surface sloped to match that of the bottom chamfer on reticle 127. Similarly, each of the beveled concavities on the reticle retainer 114 would be replaced by a surface sloped to match the chamfer along the top edge of reticle 127. In this embodiment, it is contemplated that the reticle support mechanism 110 would contact the reticle at each of its four sides, or alternatively, only along two opposite sides. Additionally, in this embodiment, it is contemplated that the reticle support mechanism 110 may contact a reticle at one, two or more points along a single side of the reticle. It is also contemplated that the reticle retainer portions in engagement with the reticle not align directly over the reticle support portions in engagement with the reticle.

Figure 16:
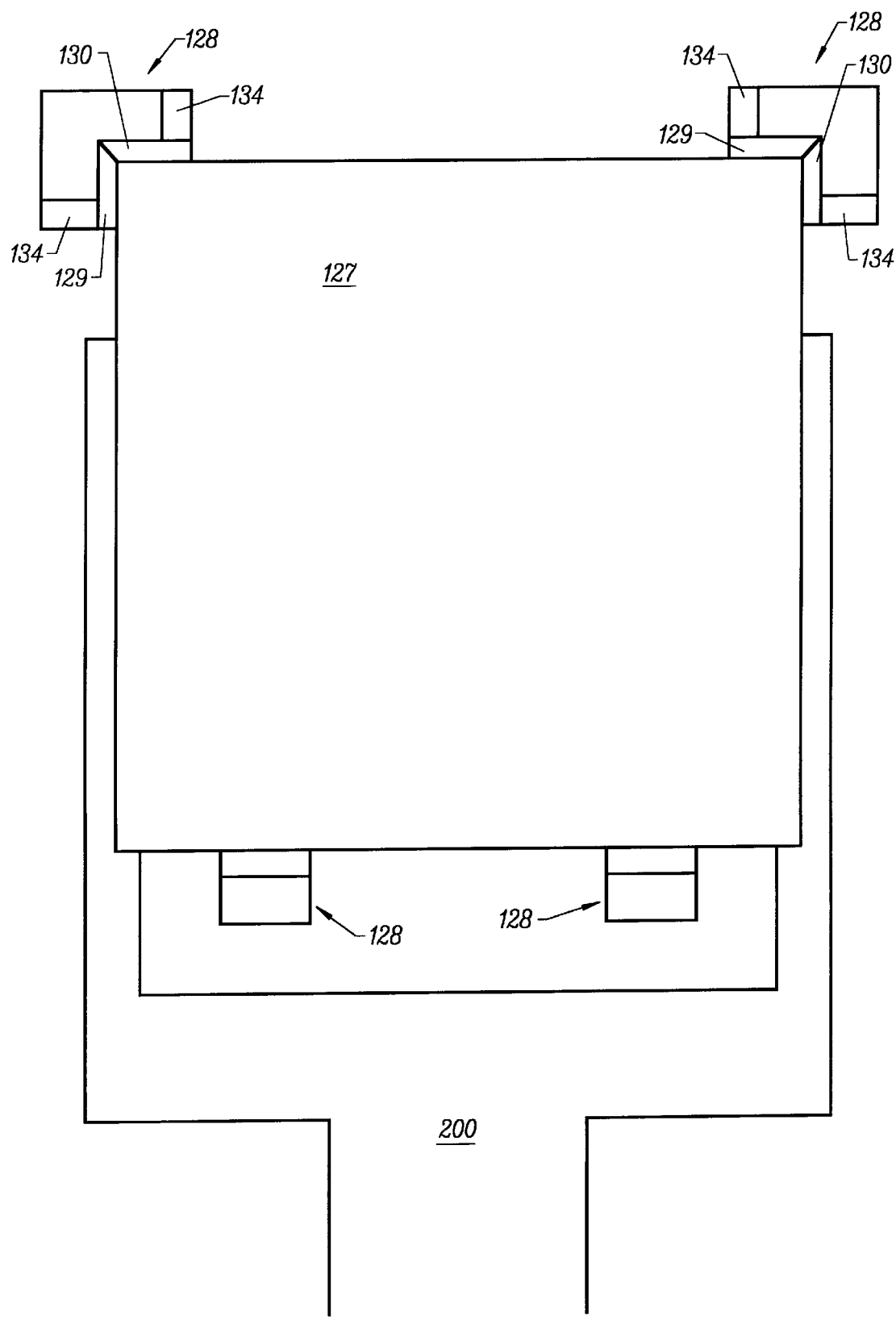
FIG. 16 is a top view of an alternative embodiment of the reticle support mechanism according to the present invention.
Figure 17:
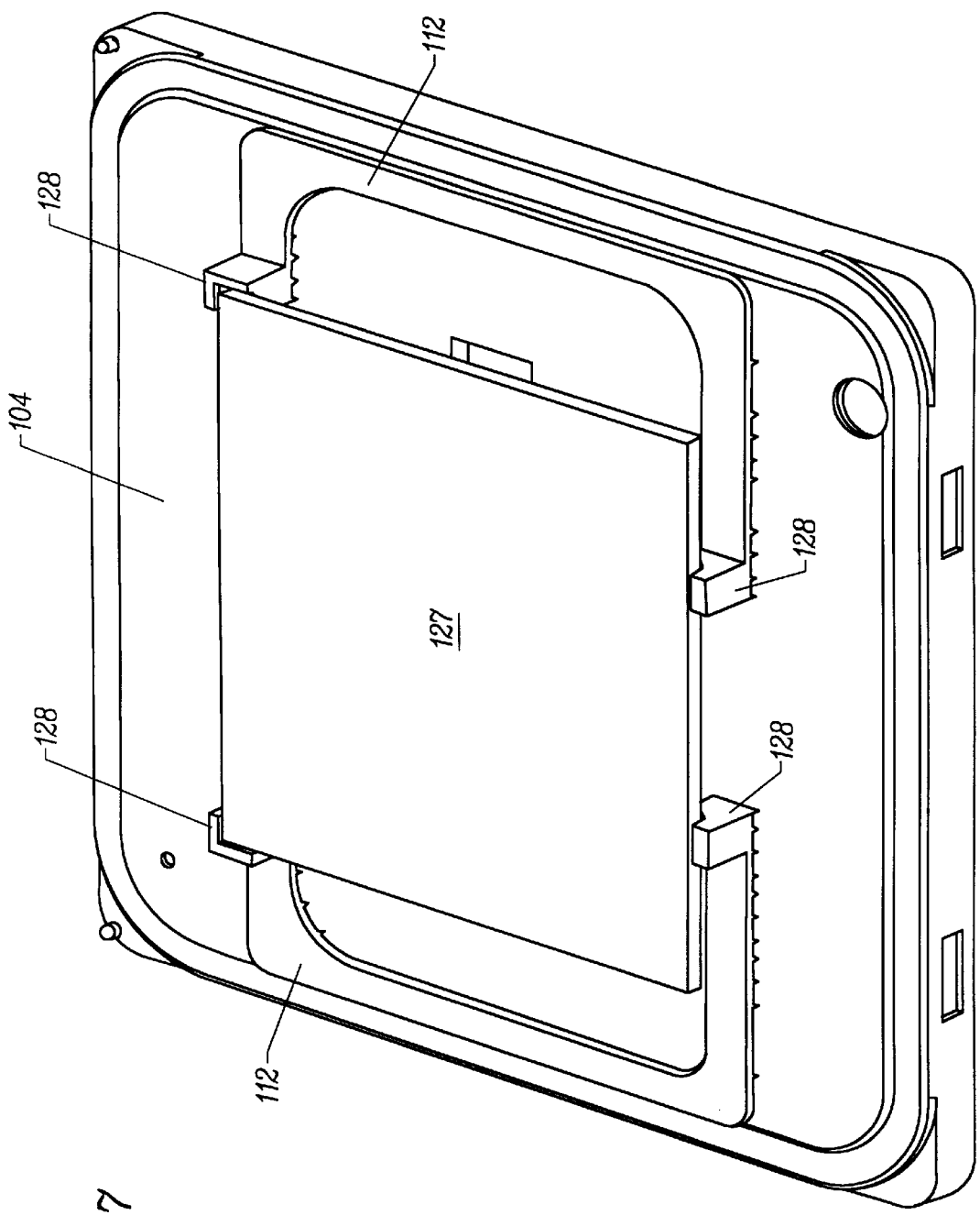
FIG. 17 is a perspective view of the alternative embodiment of the reticle support mechanism shown in FIG. 16.

In a further embodiment, it is contemplated that the reticle support mechanism 110 comprise a pair of beveled concavities above and below the reticle in two adjacent corners of the reticle, and supports midway between the two remaining corners as shown in FIGS. 16 and 17. This embodiment is adapted to operate with a fork-type reticle gripper mechanism 200.

Although the invention has been described in detail herein, it should be understood that the invention is not limited to the embodiments herein disclosed. Various changes, substitutions and modifications may be made thereto by those skilled in the art without departing from the spirit or scope of the invention as described and defined by the appended claims.

We claim:

1. A container for supporting a workpiece having four corners, the workpiece including a chamfer around upper and lower edges of the workpiece, the container including a door and a shell capable of coupling with the door to define an isolated environment within the container, the container comprising:

a workpiece support mounted to said door, said workpiece support including four support posts, a support post of said four support posts capable of supporting the workpiece at a corner of the four corners, said support post including:

a pair of sloping sidewalls, said pair of sloping sidewalls capable of supporting adjoining sides of the workpiece at said corner, a tilt limiting section at a bottom of said pair of sloping sidewalls for preventing said corner from falling down out of said support post, and a stopper projection at a top of said pair of sloping sidewalls for preventing said corner from rotating up out of said support post.

2. A container for supporting a workpiece as recited in claim 1, said pair of sloping sidewalls engaging the workpiece at the chamfer along a lower edge of the workpiece.

3. A container for supporting a workpiece as recited in claim 1, wherein the workpiece comprises a reticle.

4. A container for supporting a reticle having four corners, the reticle including a chamfer around upper and lower edges of the reticle, the container including a door and a shell capable of coupling with the door to define an isolated environment within the container, the container comprising:

a reticle support mounted to said door, said reticle support including four support posts, a support post of said four support posts capable of supporting the reticle at a corner of the four corners, said support post including a pair of sloping sidewalls, said pair of sloping sidewalls capable of supporting the chamfer at a lower edge of the reticle at adjoining sides of said corner; and a reticle retainer including:

a base affixed to the shell of the container, and a cantilevered section affixed to said base capable of engaging the chamfer along an upper edge of the reticle upon coupling of the shell with the door, said cantilevered section being capable of flexing to differing degrees depending on a position of the reticle on the door.

5. A container for supporting a reticle as recited in claim 4, said reticle support further comprising:

a tilt limiting section at a bottom of said pair of sloping sidewalls for preventing said corner from falling down out of said support post, and a stopper projection at a top of said pair of sloping sidewalls for preventing said corner from rotating up out of said support post.

6. A container for supporting a reticle as recited in claim 4, wherein the container comprises a first container, the first container further comprising at least one boss formed on a top surface of the shell, said at least one boss allowing a second container substantially similar to the first container to be seated atop the first container.

* * * * *